US011581215B2

(12) United States Patent
Calvo et al.

(10) Patent No.: US 11,581,215 B2
(45) Date of Patent: Feb. 14, 2023

(54) BODY-SOURCE-TIED SEMICONDUCTOR-ON-INSULATOR (SOI) TRANSISTOR

(71) Applicant: Newport Fab, LLC, Newport Beach, CA (US)

(72) Inventors: Allan K Calvo, Tustin, CA (US); Paul D Hurwitz, Irvine, CA (US); Roda Kanawati, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 42 days.

(21) Appl. No.: 16/928,962

(22) Filed: Jul. 14, 2020

(65) Prior Publication Data

US 2022/0020633 A1   Jan. 20, 2022

(51) Int. Cl.
| | |
|---|---|
| *H01L 27/12* | (2006.01) |
| *H01L 21/762* | (2006.01) |
| *H01L 29/49* | (2006.01) |
| *H01L 23/66* | (2006.01) |

(52) U.S. Cl.
CPC ........ *H01L 21/76243* (2013.01); *H01L 23/66* (2013.01); *H01L 27/1203* (2013.01); *H01L 29/4916* (2013.01)

(58) Field of Classification Search
CPC ................. H01L 27/1203; H01L 29/4916
See application file for complete search history.

(56) References Cited

U.S. PATENT DOCUMENTS

| | | | | |
|---|---|---|---|---|
| 6,049,104 A * | 4/2000 | Hshieh | ............... | H01L 29/1095 257/328 |
| 6,870,218 B2 * | 3/2005 | Cai | ..................... | H01L 29/1095 257/335 |
| 6,992,353 B1 * | 1/2006 | Wu | .................. | H01L 29/66719 257/335 |
| 8,110,869 B2 * | 2/2012 | Bhalla | ................ | H01L 29/7813 257/329 |

(Continued)

OTHER PUBLICATIONS

R. T. Toh, et al. "A 300mm Foundry HRSOI Technology with Variable Silicon Thickness for Integrated FEM Applications," 2016 *IEEE International Electron Devices Meeting (IEDM)*, pp. 2.4.1-2.4.4, Dec. 2016, San Francisco, CA.

(Continued)

*Primary Examiner* — Eugene Lee
(74) *Attorney, Agent, or Firm* — Farjami & Farjami LLP

(57) ABSTRACT

A semiconductor-on-insulator (SOI) transistor includes a semiconductor layer situated over a buried oxide layer, the buried oxide layer being situated over a substrate. The SOI transistor is situated in the semiconductor layer and includes a transistor body, gate fingers, source regions, and drain regions. The transistor body has a first conductivity type. The source regions and the drain regions have a second conductivity type opposite to the first conductivity type. A heavily-doped body-implant region has the first conductivity type and overlaps at least one source region. A common silicided region electrically ties the heavily-doped body-implant region to the at least one source region. The common silicided region can include a source silicided region, and a body tie silicided region situated over the heavily-doped body-implant region. The source silicided region can be separated from a drain silicided region by the gate fingers.

20 Claims, 9 Drawing Sheets

(56) References Cited

U.S. PATENT DOCUMENTS

| | | | | |
|---|---|---|---|---|
| 8,236,640 B2* | 8/2012 | Smith | H01L 29/0847 | |
| | | | 438/296 | |
| 8,754,469 B2* | 6/2014 | Pendharkar | H01L 29/0696 | |
| | | | 257/330 | |
| 9,136,263 B2* | 9/2015 | Koyama | H01L 27/0266 | |
| 9,553,187 B2* | 1/2017 | Chen | H01L 21/28105 | |
| 10,325,833 B1* | 6/2019 | Kanawati | H01L 21/84 | |
| 2007/0141792 A1* | 6/2007 | Cai | H01L 29/1095 | |
| | | | 438/286 | |
| 2008/0237708 A1* | 10/2008 | Mandelman | H01L 29/78615 | |
| | | | 257/347 | |
| 2009/0014791 A1* | 1/2009 | Anderson | H01L 29/7835 | |
| | | | 257/337 | |
| 2009/0261410 A1* | 10/2009 | Otake | H01L 29/4238 | |
| | | | 257/342 | |
| 2010/0314686 A1* | 12/2010 | Hirano | H01L 29/78609 | |
| | | | 257/351 | |
| 2011/0042742 A1* | 2/2011 | Bhalla | H01L 29/66734 | |
| | | | 257/334 | |
| 2013/0126983 A1* | 5/2013 | Bulucea | H01L 21/823878 | |
| | | | 257/402 | |
| 2014/0054602 A1* | 2/2014 | Johnson | H01L 29/7787 | |
| | | | 257/288 | |
| 2015/0084130 A1* | 3/2015 | Yin | H01L 21/76283 | |
| | | | 257/348 | |
| 2018/0076319 A1* | 3/2018 | Mallikarjunaswamy | | |
| | | | H01L 29/1095 | |
| 2019/0123166 A1* | 4/2019 | Kanawati | H01L 29/665 | |
| 2019/0288006 A1* | 9/2019 | Paul | H01L 28/40 | |

OTHER PUBLICATIONS

R. V. Purakh, et al. "A 130nm RFSOI Technology with Switch, LNA, and EDNMOS Devices for Integrated Front-End module SoC Applications," 2015 *IEEE Radio Frequency Integrated Circuits Symposium (RFIC)*, pp. 47-50, May 2015, Phoenix, AZ.

* cited by examiner

US 11,581,215 B2

BODY-SOURCE-TIED SEMICONDUCTOR-ON-INSULATOR (SOI) TRANSISTOR

BACKGROUND

Semiconductor-on-insulator (SOI) devices are commonly employed in radio frequency (RF) circuits where high noise isolation and low signal loss are required. These SOI devices use a buried oxide (BOX) to isolate RF circuit components, such as transistors and/or passive components, in a top semiconductor layer. In amplifier designs, such as low noise amplifiers, SOI transistors are required to be highly linear in order to meet more stringent standards.

In order to meet linearity requirements, in one approach, an SOI transistor employs a floating body. However, floating body transistors exhibit detrimental body effects. In another approach, dedicated transistor body contacts are connected to the transistor body to counteract body effects. However, the body contacts can increase parasitic capacitance. Body contacted transistors also typically employ gate structures, such as "T" shaped gate structures, overlying the transistor body, which results in increased gate resistance and further increased parasitic capacitance in the SOI transistor, which in turn results in increased noise in the amplifier. Body contacted transistors also have increased footprints.

Thus, there is a need in the art for SOI transistors that have improved linearity without sacrificing performance parameters and manufacturing conveniences.

SUMMARY

The present disclosure is directed to a body-source-tied semiconductor-on-insulator (SOI) transistor, substantially as shown in and/or described in connection with at least one of the figures, and as set forth in the claims.

DETAILED DESCRIPTION

Figure 1:
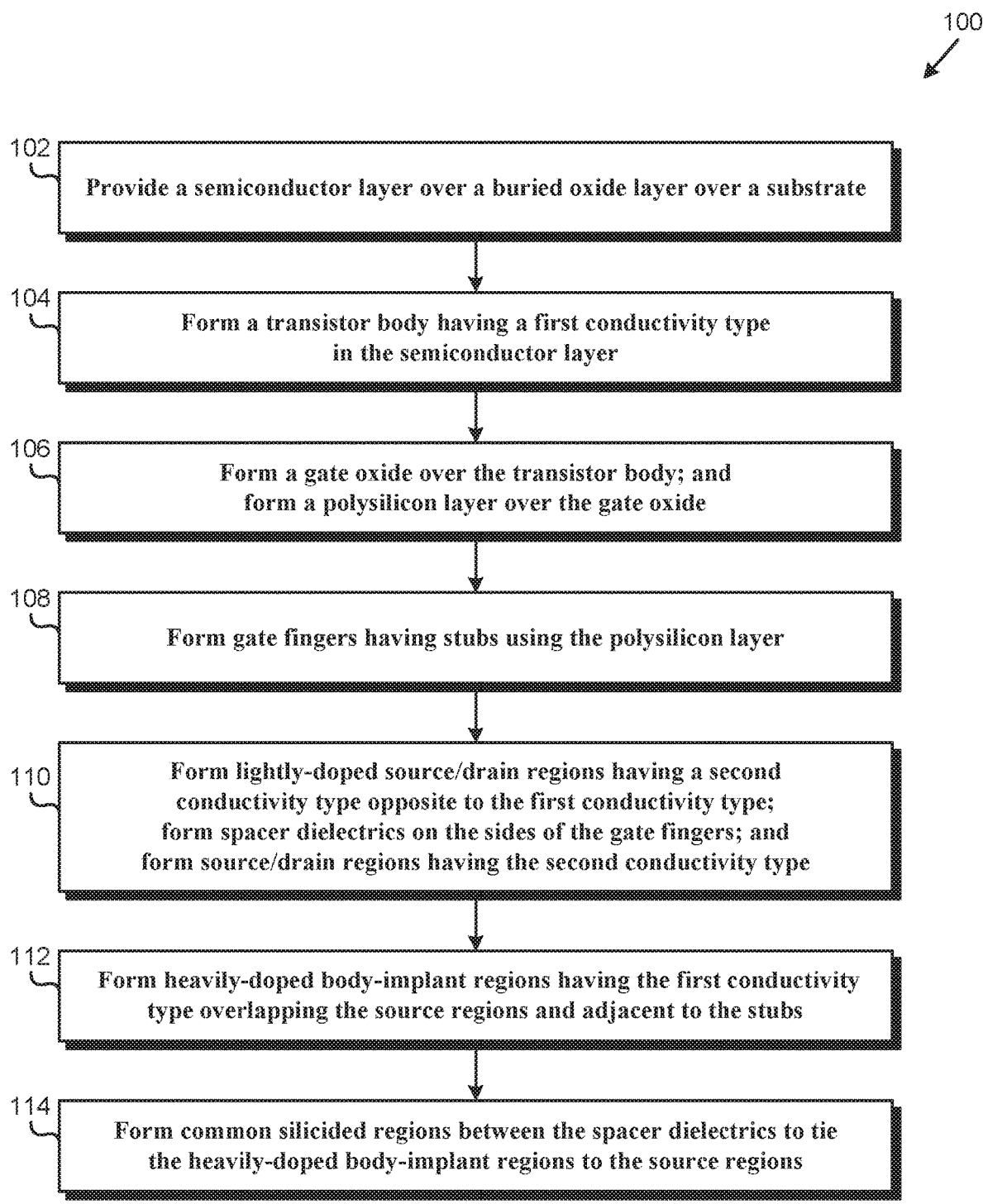
FIG. 1 illustrates a flowchart of an exemplary method for manufacturing a semiconductor-on-insulator (SOI) transistor according to one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Figure 2:
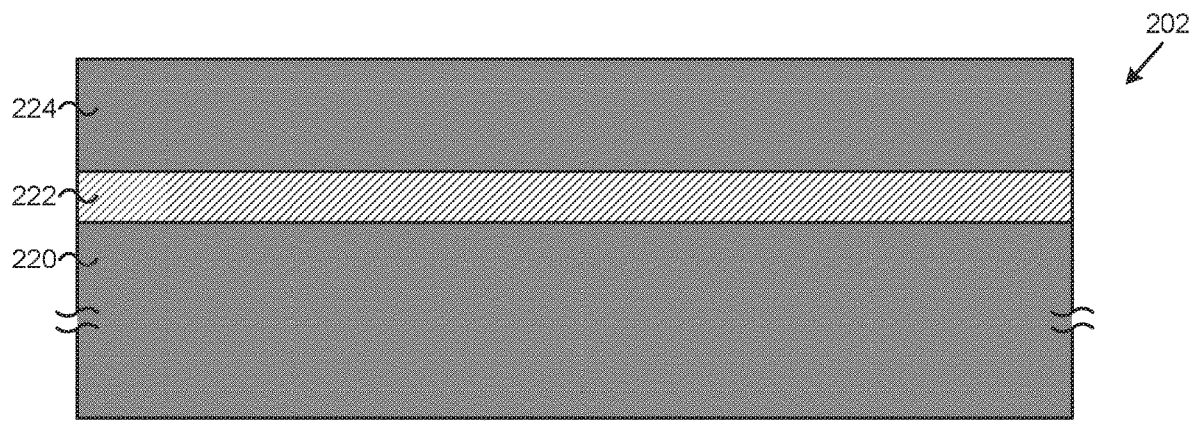
FIG. 2 illustrates an SOI transistor structure processed in accordance with action 102 in the flowchart of FIG. 1 according to one implementation of the present application.
Figure 3:
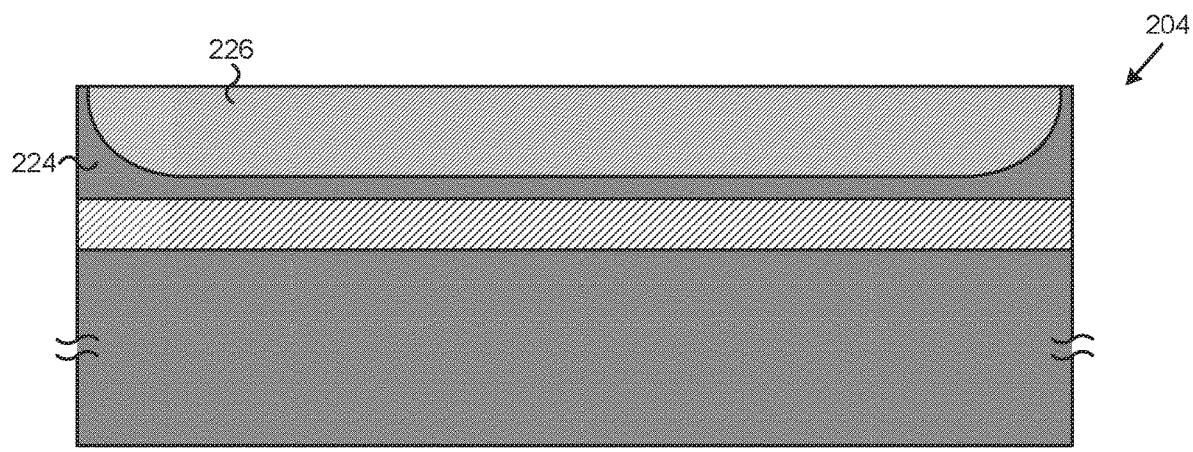
FIG. 3 illustrates an SOI transistor structure processed in accordance with action 104 in the flowchart of FIG. 1 according to one implementation of the present application.

FIG. 1 illustrates a flowchart of an exemplary method for manufacturing a semiconductor-on-insulator (SOI) transistor according to one implementation of the present application. Structures shown in FIGS. 2 through 9D illustrate the results of performing actions 102 through 114 shown in the flowchart of FIG. 1. For example, FIG. 2 shows an SOI transistor structure after performing action 102 in FIG. 1, FIG. 3 shows an SOI transistor structure after performing action 104 in FIG. 1, and so forth.

Actions 102 through 114 shown in the flowchart of FIG. 1 are sufficient to describe one implementation of the present inventive concepts. Other implementations of the present inventive concepts may utilize actions different from those shown in the flowchart of FIG. 1. Certain details and features have been left out of the flowchart that are apparent to a person of ordinary skill in the art. For example, an action may consist of one or more sub-actions or may involve specialized equipment or materials, as known in the art.

Moreover, some actions, such as masking and cleaning actions, are omitted so as not to distract from the illustrated actions.

FIG. 2 illustrates an SOI transistor structure processed in accordance with action 102 in the flowchart of FIG. 1 according to one implementation of the present application. As shown in FIG. 2, SOI transistor structure 202 is provided. SOI transistor structure 202 includes semiconductor layer 224 over buried oxide (BOX) layer 222 over substrate 220.

Semiconductor layer 224, buried oxide (BOX) layer 222, and substrate 220 can be provided together as a pre-fabricated SOI wafer. In various implementations, a bonded and etch back SOI (BESOI) process, a separation by implantation of oxygen (SIMOX) process, or a "smart cut" process can be used for fabricating the SOI wafer as known in the art.

In various implementations substrate 220 can be silicon, high-resistivity silicon, germanium, or group III-V material. For example, substrate 220 can be monocrystalline bulk silicon. BOX layer 222 is situated on substrate 220. BOX layer 222 can be silicon dioxide or another oxide. Semiconductor layer 224 is situated on BOX layer 222. Semiconductor layer 224 can include any semiconductor material. For example, semiconductor layer 224 can be epitaxial silicon. As described below, one or more SOI transistors can be fabricated in semiconductor layer 224.

FIG. 3 illustrates an SOI transistor structure processed in accordance with action 104 in the flowchart of FIG. 1 according to one implementation of the present application. As shown in FIG. 3, in SOI transistor structure 204, a transistor body 226 is formed in semiconductor layer 224. Transistor body 226 has a first conductivity type. For example, transistor body 226 can be implanted with boron or another appropriate P type dopant, such that transistor body 226 has P type conductivity.

Figure 4:
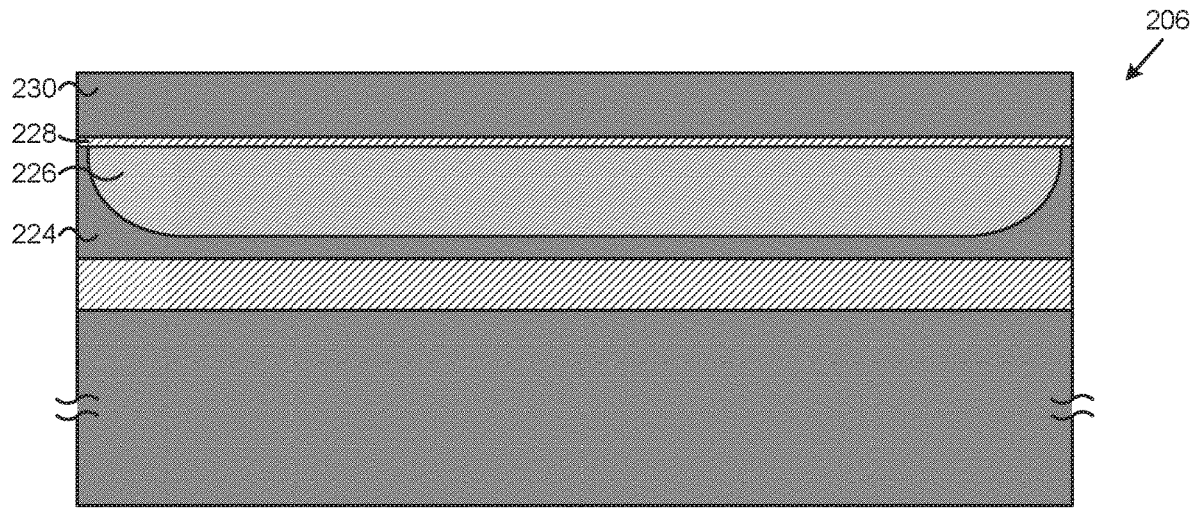
FIG. 4 illustrates an SOI transistor structure processed in accordance with action 106 in the flowchart of FIG. 1 according to one implementation of the present application.

FIG. 4 illustrates an SOI transistor structure processed in accordance with action 106 in the flowchart of FIG. 1 according to one implementation of the present application. As shown in FIG. 4, in SOI transistor structure 206, gate oxide 228 is formed over transistor body 226 as well as over portions of semiconductor layer 224. Gate oxide 228 can comprise, for example, silicon dioxide ($SiO_2$) or another dielectric. As also shown in FIG. 4, polycrystalline silicon (polysilicon) layer 230 is formed over gate oxide 228. Gate oxide 228 and polysilicon layer 230 can be formed by any technique known in the art.

Figure 5:
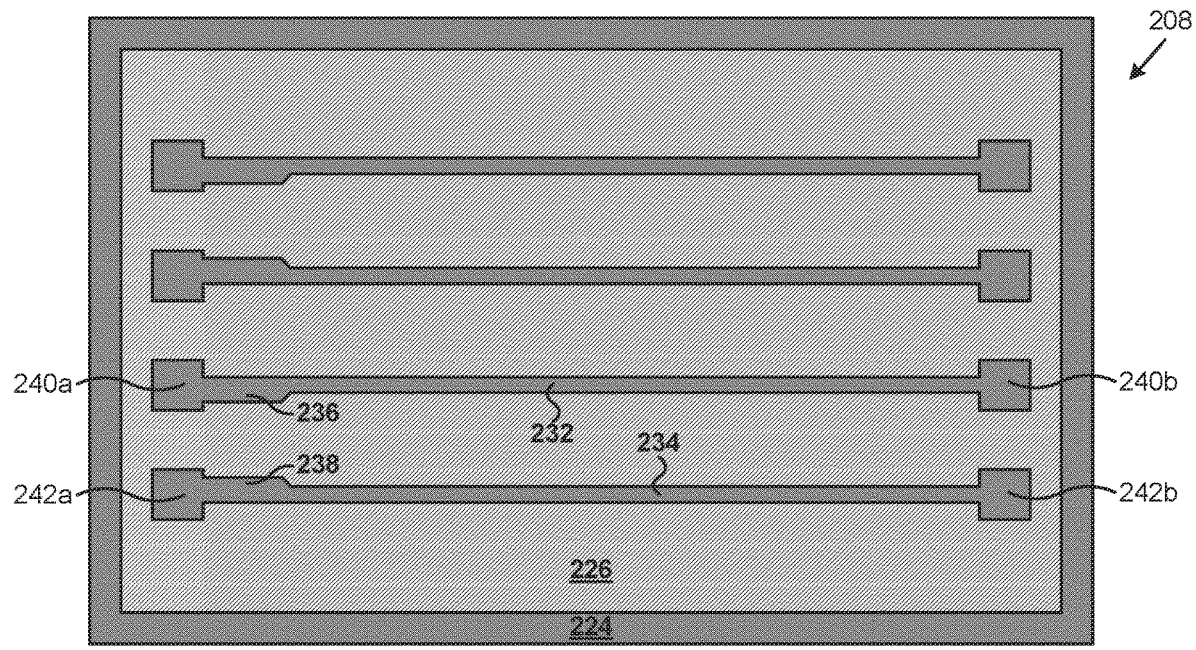
FIG. 5 illustrates an SOI transistor structure processed in accordance with action 108 in the flowchart of FIG. 1 according to one implementation of the present application.

FIG. 5 illustrates a top view of an SOT transistor structure processed in accordance with action 108 in the flowchart of FIG. 1 according to one implementation of the present application. As shown in FIG. 5, in SOI transistor structure 208, exemplary gate fingers 232 and 234 having respective stubs 236 and 238 are formed from polysilicon layer 230 (shown in FIG. 4). Gate contact areas (also referred to as "gate contacts" for simplicity) 240a, 240b, 242a, and 242b are also formed from polysilicon layer 230 (shown in FIG. 4). Gate fingers 232 and 234 and gate contacts 240a, 240b, 242a, and 242b can be formed by patterning polysilicon layer 230 (shown in FIG. 4) using any technique known in the art. Gate oxide 228 (shown in FIG. 4) may be concurrently patterned. Top views of transistor body 226 and semiconductor layer 224 are also shown in FIG. 5.

Gate fingers 232 and 234 are narrow elongated segments of polysilicon. Gate fingers 232 and 234 can be used to induce a conductive channel in transistor body 226. Gate contacts 240a, 240b, 242a, and 242b are segments of polysilicon at terminal portions of gate fingers 232 and 234. Gate contacts 240a, 240b, 242a, and 242b are wider than gate fingers 232 and 234. Gate contacts 240a, 240b, 242a, and 242b facilitate connecting electrical connectors, such as vias and routings, to gate fingers 232 and 234.

As shown in FIG. 5, stubs 236 and 238 of gate fingers 232 and 234 are segments of polysilicon wider than the remaining portions of gate fingers 232 and 234. In the present implementation, stubs 236 and 238 are situated at terminal portions of gate fingers 232 and 234 near gate contacts 240a and 242a. In the present implementation, stubs 236 and 238 face towards one another as shown in FIG. 5. In various implementations, stubs 236 and 238 can be situated near gate contacts 240b and 242b instead of, or in addition to near gate contacts 240a and 242a. In the present implementation, stubs 236 and 238 are wider than the remaining portions of gate fingers 232 and 234, but narrower than gate contacts 240a, 240b, 242a, and 242b. In various implementations, stubs 236 and 238 may have any other dimensions relative to gate contacts 240a, 240b, 242a, and 242b. In various implementations, gate fingers 232 and 234, gate contacts 240a, 240b, 242a, and 242b, and stubs 236 and 238 can have various shapes or dimensions other than those shown in FIG. 5.

Figure 6:
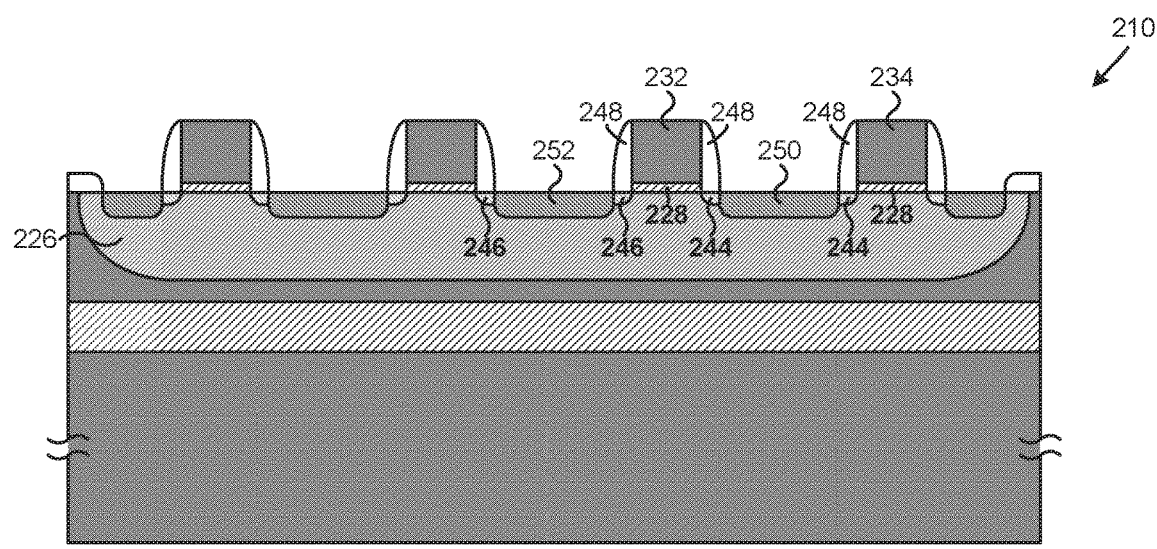
FIG. 6 illustrates an SOI transistor structure processed in accordance with action 110 in the flowchart of FIG. 1 according to one implementation of the present application.

FIG. 6 illustrates an SOI transistor structure processed in accordance with action 110 in the flowchart of FIG. 1 according to one implementation of the present application. As shown in FIG. 6, in SOI transistor structure 210, lightly-doped source regions 244 and lightly doped drain regions 246 are formed in transistor body 226, spacer dielectrics 248 are formed on sides of gate fingers 232 and 234, and source regions 250 and drain regions 252 are formed in transistor body 226.

Source regions 250 and drain regions 252, as well as lightly-doped source regions 244 and lightly doped drain regions 246, have a second conductivity type opposite to the first conductivity type. Continuing the above example, where transistor body 226 has P type conductivity, source regions 250 and drain regions 252, as well as lightly-doped source regions 244 and lightly doped drain regions 246, can be implanted with phosphorus or another appropriate N type dopant. As known in the art, lightly-doped source regions 244 and lightly doped drain regions 246 can be regions having lower dopant concentration than source regions 250 and drain regions 252. Lightly-doped source regions 244 and lightly doped drain regions 246 can have a lower implantation energy, such that source regions 250 and drain regions 252 extend deeper into transistor body 226. Source regions 250 and lightly-doped source regions 244 together function as a transistor source. Likewise, drain regions 252 and lightly doped drain regions 246 together function as a transistor drain.

Spacer dielectrics 248 can comprise, for example, silicon nitride (SiN). Spacer dielectrics 248 can be formed, for example, by a conformal CVD deposition followed by removal of select portions over and between gate fingers 232 and 234. As a result, spacer dielectrics 248 can be situated on sides of gate fingers 232 and 234, separating gate fingers 232 and 234 from source regions 250 and drain regions 252. In the present implementation, spacer dielectrics 248 are formed after lightly-doped source regions 244 and lightly doped drain regions 246, but before source regions 250 and drain regions 252. Thus, lightly-doped source regions 244 and lightly doped drain regions 246 are aligned with gate fingers 232 and 234, while source regions 250 and drain regions 252 are aligned with spacer dielectrics 248.

Figure 7A:
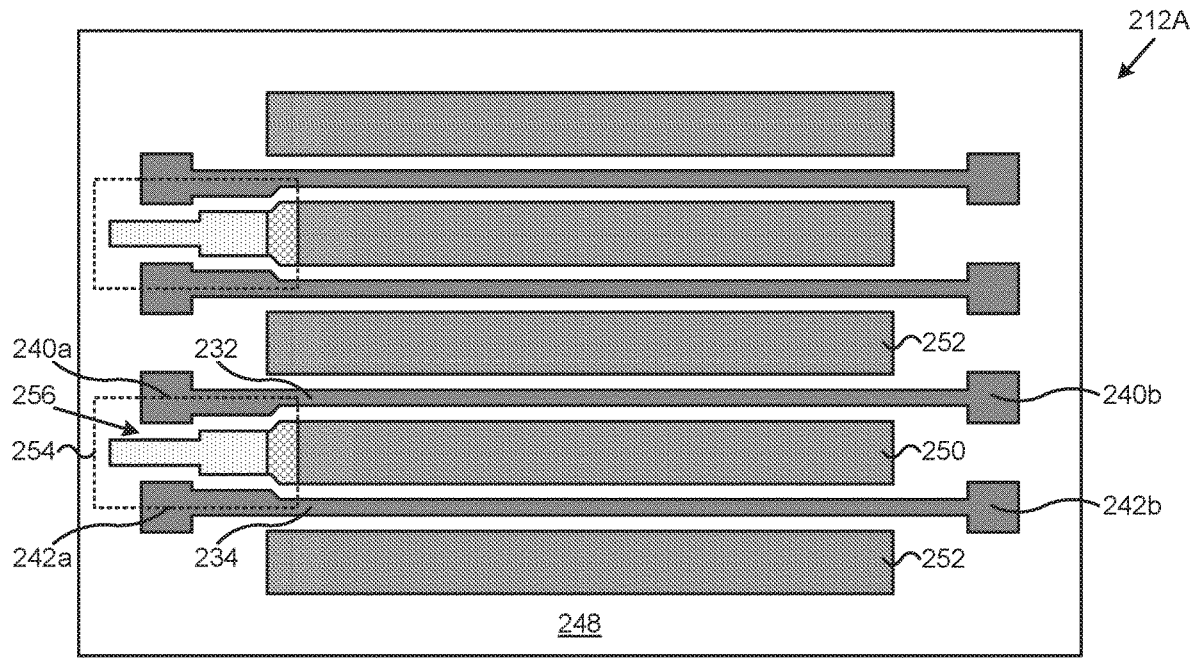
FIG. 7A illustrates an SOI transistor structure processed in accordance with action 112 in the flowchart of FIG. 1 according to one implementation of the present application.

FIG. 7A illustrates an SOI transistor structure processed in accordance with action 112 in the flowchart of FIG. 1 according to one implementation of the present application.

As shown in FIG. 7A, in SOI transistor structure 212A, heavily-doped body-implant regions 256 are formed overlapping source regions 250. Heavily-doped body-implant regions 256 are situated partially outside source regions 250 and near gate contacts 240a and 240b. Mask openings 254 show regions where openings may be defined in an exemplary mask, such that an implant can form heavily-doped body-implant regions 256 in transistor body 226 (shown in FIG. 6) and overlapping source regions 250.

Heavily-doped body-implant regions 256 have the first conductivity type. Continuing the above example, where transistor body 226 (shown in FIG. 6) has P type conductivity and source regions 250 and drain regions 252 have N type conductivity, heavily-doped body-implant regions 256 can be implanted with boron or another appropriate P type dopant. Heavily-doped body-implant regions 256 have a significantly higher dopant concentration compared to transistor body 226. For example, if transistor body 226 has a dopant concentration of approximately $1.0*10^{17}/cm^3$, heavily-doped body-implant regions 256 can have a dopant concentration of approximately $1.0*10^{20}/cm^3$.

Figure 7B:
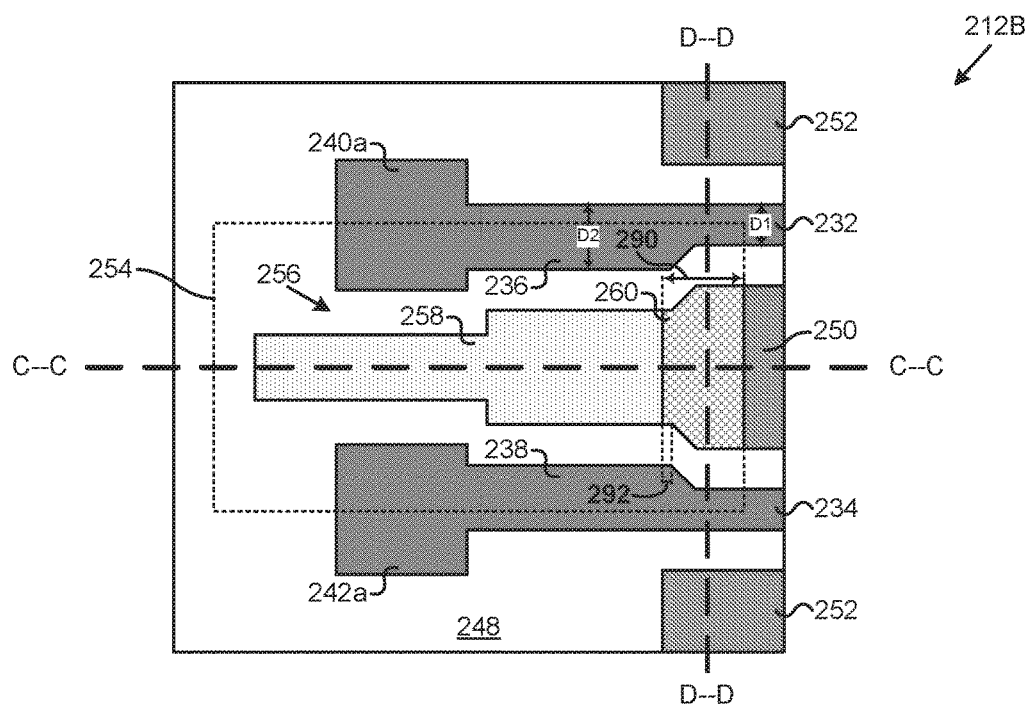
FIG. 7B illustrates a top view of a portion of an SOI transistor structure corresponding to the SOI transistor structure of FIG. 7A according to one implementation of the present application.

FIG. 7B illustrates a top view of a portion of an SOI transistor structure corresponding to the SOI transistor structure of FIG. 7A according to one implementation of the present application. As shown in FIG. 7B, heavily-doped body-implant regions 256 comprise body tie regions 258 and overlap regions 260. Body tie regions 258 represent portions of heavily-doped body-implant regions 256 outside source regions 250. Overlap regions 260 represent portions of heavily-doped body-implant regions 256 overlapping source regions 250. The overlap distance 290 of overlap region 260 can be tuned to optimize the performance of SOI transistor structure 212B.

As described above, mask openings 254 show regions where openings may be defined in an exemplary mask, such that an implant can form heavily-doped body-implant regions 256 in transistor body 226 (shown in FIG. 6) and overlapping source regions 250. For example, mask region 254 can have boundaries approximately aligned over midpoints of gate fingers 232 and 234 (i.e., halfway along dimension D1), and overlapping source regions 250 by more than a minimum process rule, as shown in FIG. 7B. Thus, an implant can reliably form heavily-doped body-implant regions 256 across transistor body 226 (shown in FIG. 6) between gate fingers 232 and 234 and/or between spacer dielectrics 248, and overlapping source regions 250, while providing some tolerance for misalignment, and avoiding overlapping drain regions 252.

As further shown in FIG. 7B, heavily-doped body-implant regions 256 are formed overlying and/or adjacent to stubs 236 and 238 of gate fingers 232 and 234. Stubs 236 and 238 face each other as described above. Stubs 236 and 238 have tapered portions that gradually narrow from width D2 to width D1. In the present implementation, stubs 236 and 238 taper from the greater width D2 to the smaller width D1 using a slanted portion at a taper angle of about forty five degree (45°). In various implementations, a taper angle greater than or less than forty five degree (45°) may be used. The wider portions of stubs 236 and 238 can be overplotted beyond source regions 250. For example, as shown in FIG. 7B, width D2 of stubs 236 and 238 is maintained, i.e. is overplotted, relative to source regions 250 by overplot distance 292, before stubs 236 and 238 begin to taper. The overplot distance 292 of stubs 236 and 238 can be tuned to optimize the performance of SOI transistor structure 212B. Spacer dielectrics 248, heavily-doped body-implant regions 256, and source regions 250 may roughly mirror the contours of gate contacts, 240a and 242a, stubs 236 and 238, and gate fingers 232 and 234.

Figure 7C:
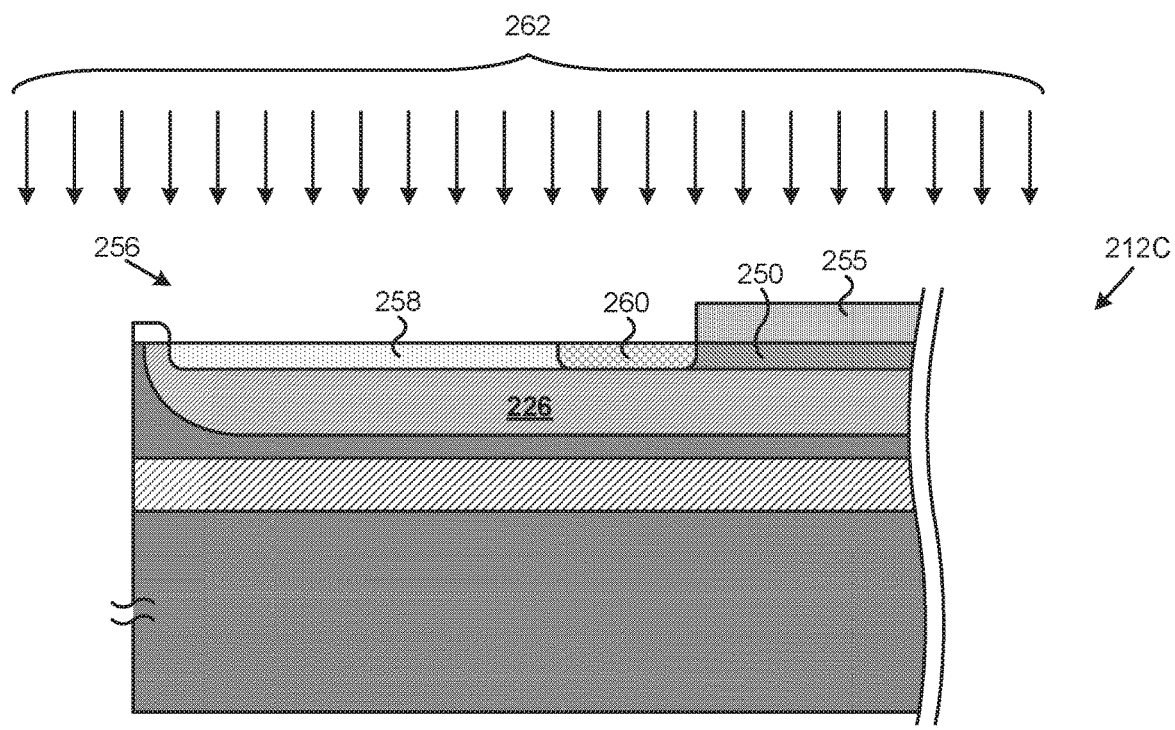
FIG. 7C illustrates a cross-sectional view of a portion of an SOI transistor structure corresponding to the SOI transistor structure of FIG. 7B according to one implementation of the present application.

FIG. 7C illustrates a cross-sectional view of a portion of an SOI transistor structure corresponding to the SOI transistor structure of FIG. 7B according to one implementation of the present application. FIG. 7C represents a cross-section along line "C-C" in FIG. 7B. As shown in FIG. 7C, SOI transistor structure 212C includes transistor body 226, heavily-doped body-implant regions 256 comprising body tie regions 258 and overlap regions 260, source regions 250, mask 255, and implant 262. In the present implementation, implant 262 is a highly concentrated P type implant. Mask 255 may be any implant mask known in the art. Mask 255 is bordered by mask openings 254 in FIGS. 7A and 7B. Mask opening 254 leaves an outer portions of source regions 250 unmasked and thus exposed to implant 262. As such, implant 262 forms heavily-doped body-implant regions 256 comprising body tie regions 258 and overlap regions 260. Notably, heavily-doped body-implant regions 256 are heavily doped with the same conductivity type as transistor body 226 and create good electrical connections to transistor body 226.

Figure 7D:
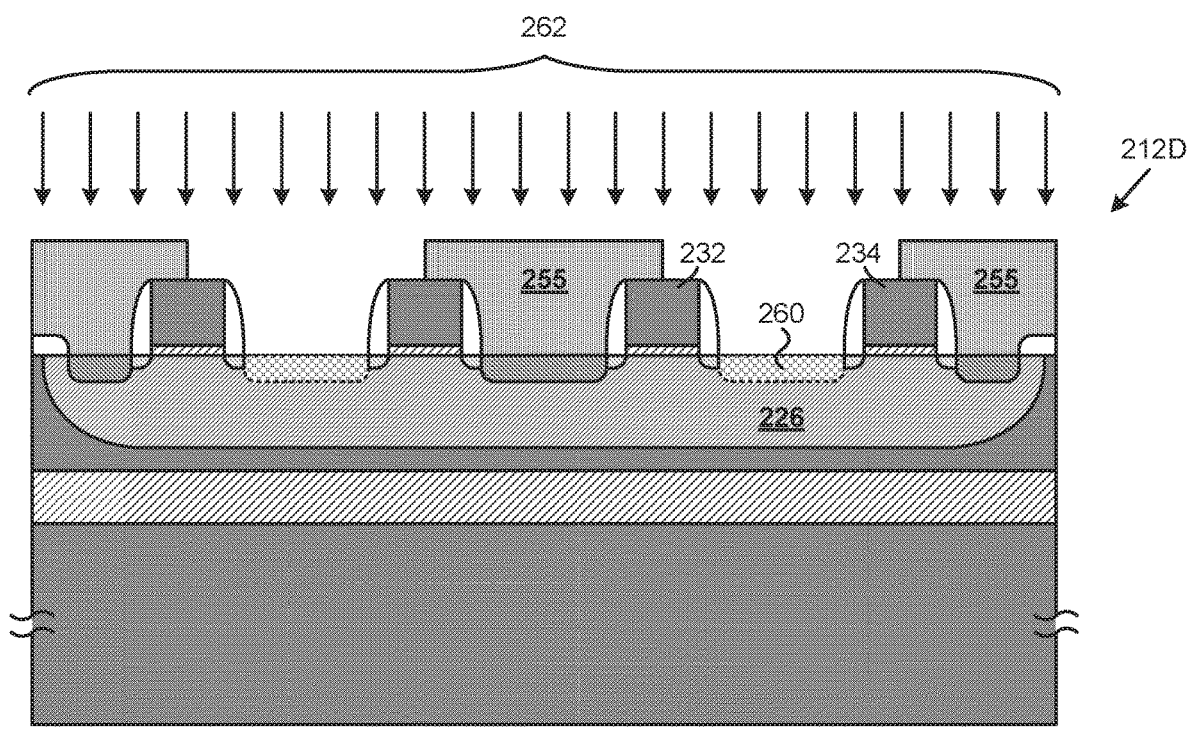
FIG. 7D illustrates a cross-sectional view of a portion of an SOT transistor structure corresponding to the SOI transistor structure of FIG. 7B according to one implementation of the present application.

FIG. 7D illustrates a cross-sectional view of a portion of an SOI transistor structure corresponding to the SOI transistor structure of FIG. 7B according to one implementation of the present application. FIG. 7D represents a cross-section along line "D-D" in FIG. 7B. As shown in FIG. 7D, SOI transistor structure 212D includes transistor body 226, overlap regions 260, gate fingers 232 and 234, mask 255, and implant 262. Mask 255 is bordered by mask openings 254 in FIGS. 7A and 7B. As described above, mask opening 254 can have boundaries approximately aligned over midpoints of gate fingers 232 and 234. Notably, because overlap regions 260 of heavily-doped body-implant regions 256 (shown in FIG. 7C) are heavily doped with the same conductivity type as transistor body 226 they create good electrical connections to transistor body 226.

Figure 8A:
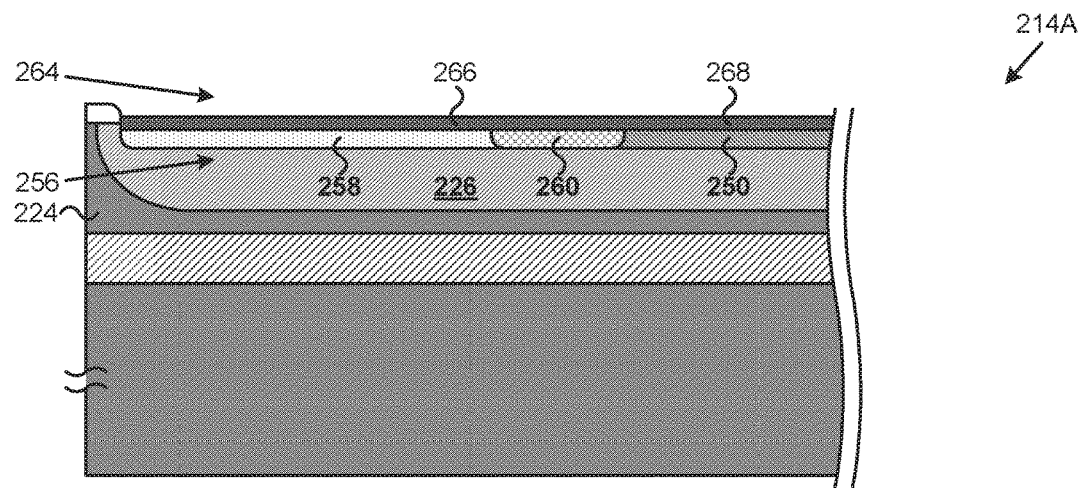
FIG. 8A illustrates an SOI transistor structure processed in accordance with action 114 in the flowchart of FIG. 1 according to one implementation of the present application.
Figure 8B:
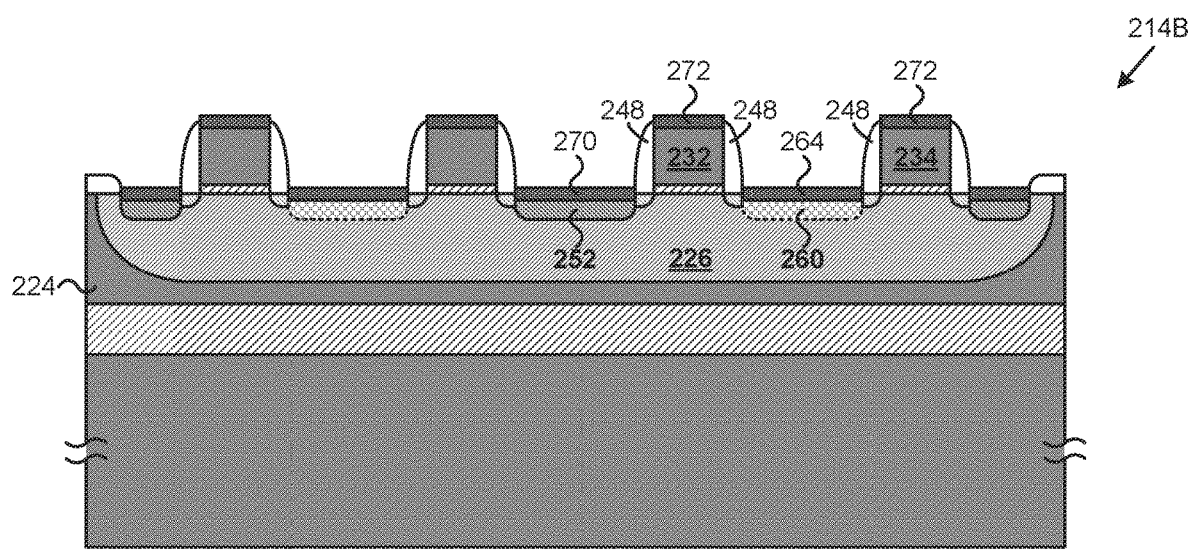
FIG. 8B illustrates a cross-sectional view of a portion of an SOI transistor structure corresponding to the SOI transistor structure of FIG. 8A according to one implementation of the present application.

FIG. 8A illustrates an SOI transistor structure processed in accordance with action 114 in the flowchart of FIG. 1 according to one implementation of the present application. FIG. 8B illustrates a cross-sectional view of a portion of an SOI transistor structure corresponding to the SOI transistor structure of FIG. 8A according to one implementation of the present application. As shown in FIGS. 8A and 8B, in SOT transistor structures 214A and 214B, common silicided regions 264 are fabricated to form a robust and a very low resistance electrical connection, i.e. to electrically tie, heavily-doped body-implant regions 256 to source regions 250. Common silicided regions 264 include body tie silicided regions 266 and source silicided regions 268. Body tie silicided regions 266 overlie both body tie regions 258 and overlap regions 260. Source silicided regions 268 overlie source regions 250.

In order to form common silicided regions 264 in FIGS. 8A and 8B, mask 255 (shown in FIGS. 7C and 7D) can be removed, then a siliciding layer can be deposited over various SOI transistor structures 212C and 212D by sputtering. In various implementations, the siliciding layer may be, nickel (Ni), cobalt (Co), platinum (Pt), or an alloy thereof. Then a thermal anneal can be performed to cause the siliciding layer to react with heavily-doped body-implant regions 256 and source regions 250, creating common silicided regions 264 a few hundred angstroms deep. As shown particularly in FIG. 8B, the siliciding layer will also react with drain regions 252 and gate fingers 232 and 234, creating drain silicided regions 270 and gate silicided regions 272. Then unreacted portions of the siliciding layer can be removed, resulting in SOI transistor structures 214A and 214B. It is noted that spacers 248 do not react during the silicidation process and are thus not silicided. As such, spacers 248 are utilized to separate and insulate various silicided regions from unintentionally shorting to each other.

Common silicided regions 264 are highly conductive. As a result, heavily-doped body-implant regions 256 are electrically tied to source regions 250. Heavily-doped body-implant regions 256 also create good electrical connections to transistor body 226. Thus, source regions 250, heavily-doped body-implant regions 256, and transistor body 226 can achieve the same electrical potential. Moreover, a dedicated contact is not needed for transistor body 226.

As stated above, spacer dielectrics 248 will not react with a siliciding layer. Because spacer dielectrics 248 are situated on sides of gate fingers 232 and 234, source silicided regions 268 of common silicided regions 264 are separated from drain silicided regions 270 by spacer dielectrics 248 and gate fingers 232 and 234. Thus, gate fingers 232 and 234 and drain silicided regions 270 will not be electrically shorted to source regions 250, and by extension, will not be electrically shorted to heavily-doped body-implant regions 256 and transistor body 226.

In one implementation, each SOI transistor structures 214A and 214B represents an N type field effect transistor (NFET); source regions 250 and drain regions 252 are N type, and heavily-doped body-implant regions 256 and transistor body 226 are P type. In other implementations, each SOI transistor structures 214A and 214B represents a P type field effect transistor (PFET), and the conductivity types are reversed; source regions 250 and drain regions 252 are P type, and heavily-doped body-implant regions 256 and transistor body 226 are N type.

SOI transistor structures 214A and 214B represent a substantially completed SOI transistor. However, SOI transistor structures 214A and 214B can also include additional elements not shown in FIGS. 8A and 8B. For example, a multi-layer stack of metallizations and interlayer dielectrics can be situated over SOI transistor structures 214A and 214B to create connections to common silicided regions 264, drain silicided regions 270, and gate silicided regions 272. SOI transistor structures 214A and 214B can also include other semiconductor devices. For example, semiconductor layer 224 can include other active devices, such as FETs. As another example, passive devices, such as inductors and capacitors, can be integrated in semiconductor layer 224 or in an overlying multi-layer stack. As yet another example, SOI transistor structures 214A and 214B can be part of an integrated low noise amplifier (LNA) chip.

Figure 9A:
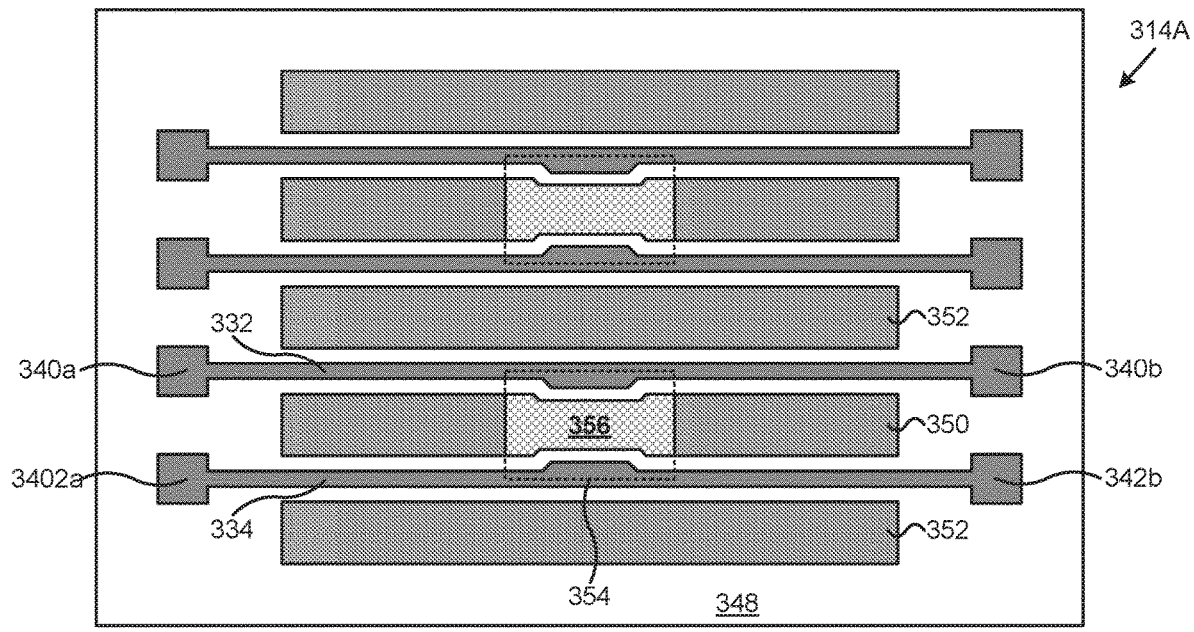
FIG. 9A illustrates an SOI transistor structure processed according to one implementation of the present application.
Figure 9B:
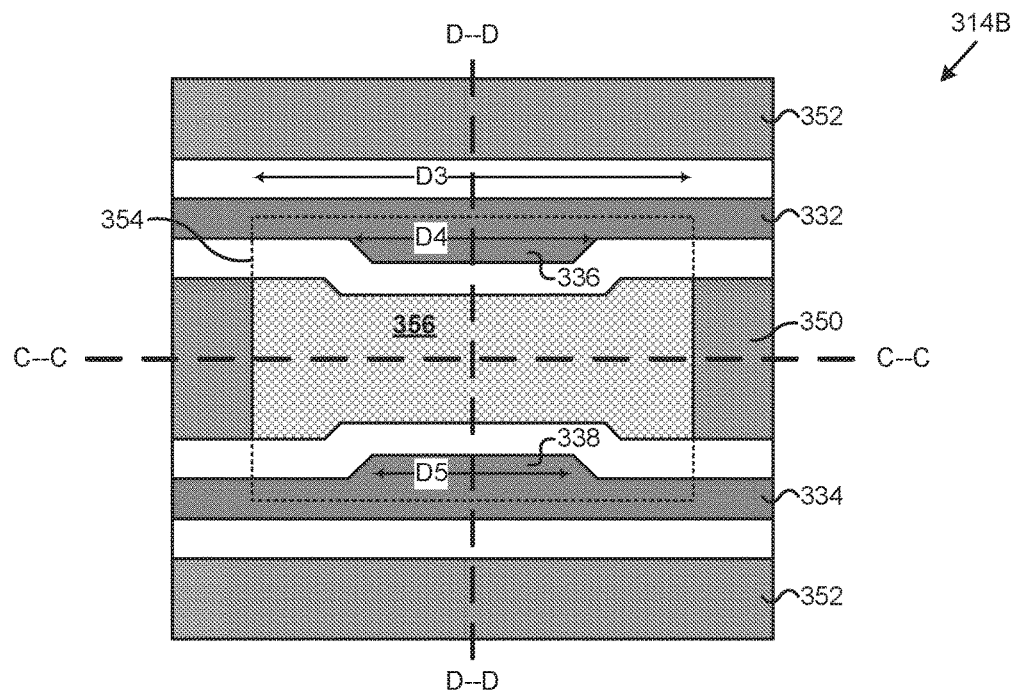
FIG. 9B illustrates a top view of a portion of an SOI transistor structure corresponding to the SOI transistor structure of FIG. 9A according to one implementation of the present application.

FIG. 9A illustrates an SOI transistor structure processed according to one implementation of the present application. FIG. 9B illustrates a top view of a portion of an SOI transistor structure corresponding to the SOI transistor structure of FIG. 9A according to one implementation of the present application. SOI transistor structures 314A and 314B in FIGS. 9A and 9B represent an alternative implementation to SOI transistor structures 212A and 212B in FIGS. 7A and 7B. Except for differences noted below, gate fingers 332 and 334 including stubs 336 and 338, gate contacts 340a, 340b, 342a, and 342b, spacer dielectrics 348, source regions 350, drain regions 352, mask openings 354, and heavily-doped body-implant regions 356 in FIGS. 9A and 9B generally correspond to gate fingers 232 and 234 including stubs 236 and 238, gate contacts 240a, 240b, 242a, and 242b, spacer dielectrics 248, source regions 250, drain regions 252, mask openings 254, and heavily-doped body-implant regions 256 in FIGS. 7A and 7B.

As shown in FIG. 9A, in SOI transistor structure 314A, heavily-doped body-implant regions 356 are formed overlapping source regions 350. Heavily-doped body-implant regions 356 are situated inside source regions 350 and near centers of gate fingers 332 and 334. Mask openings 354 show regions where openings may be defined in an exemplary mask, such that an implant can form heavily-doped body-implant regions 356 overlapping source regions 350. Heavily-doped body-implant regions 356 may be formed in a similar manner as described above with reference to action 112 in FIG. 1 and with reference to heavily-doped body-implant regions 256 in FIGS. 7A through 7D, albeit utilizing different mask openings and dimensions.

As shown in FIG. 9B, and in contrast to FIG. 7B, heavily-doped body-implant regions 356 entirely overlap source regions 350 within mask openings 354. Dimension D3 of heavily-doped body-implant regions 356 can be tuned to optimize the performance of SOI transistor structure 314B. As further shown in FIG. 9B, heavily-doped body-implant regions 356 are formed adjacent to stubs 336 and 338 of gate fingers 332 and 334. In the present implementation, stubs 336 and 338 are situated at or near centers of gate fingers 332 and 334, away from gate contacts gate contacts 340a, 340b, 342a, and 342b. Stubs 336 and 338 face each other and face away from drain regions 352. Stubs 336 and 338 have tapered portions and are substantially trapezoidal in the present example. At the base of the trapezoid, stubs 336 and 338 have dimension D4. At the tip of the trapezoid, stubs 336 and 338 have dimension D5. In one implementation, dimension D4 may be approximately four hundred nanometers (700 nm), and dimension D5 may be approximately two hundred nanometers (200 nm). In the present implementation, stubs 336 and 338 have a taper angle of about forty-five degrees (45°). In various implementations, stubs 336 and 338 may have other shapes, dimensions, or taper angles.

Figure 9C:
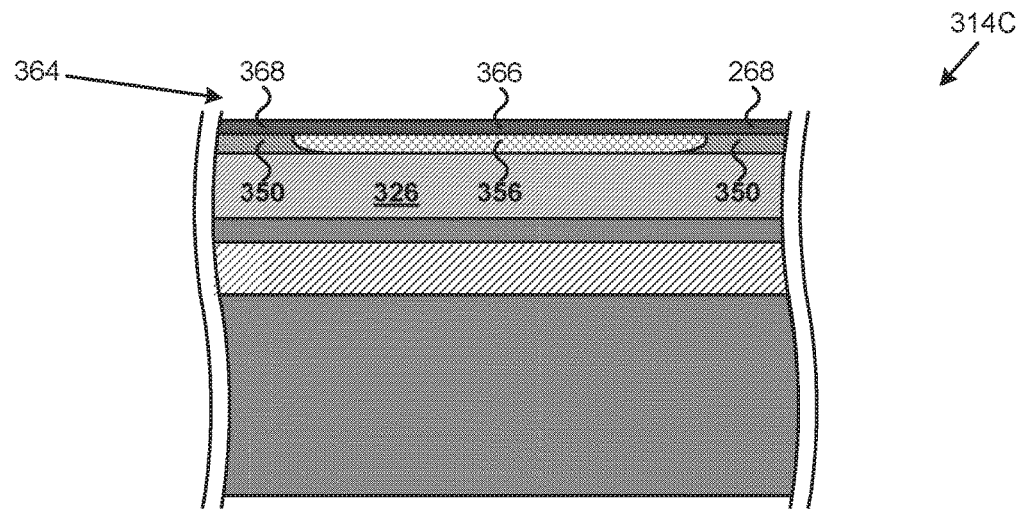
FIG. 9C illustrates a cross-sectional view of a portion of an SOI transistor structure corresponding to the SOI transistor structure of FIG. 9B according to one implementation of the present application.
Figure 9D:
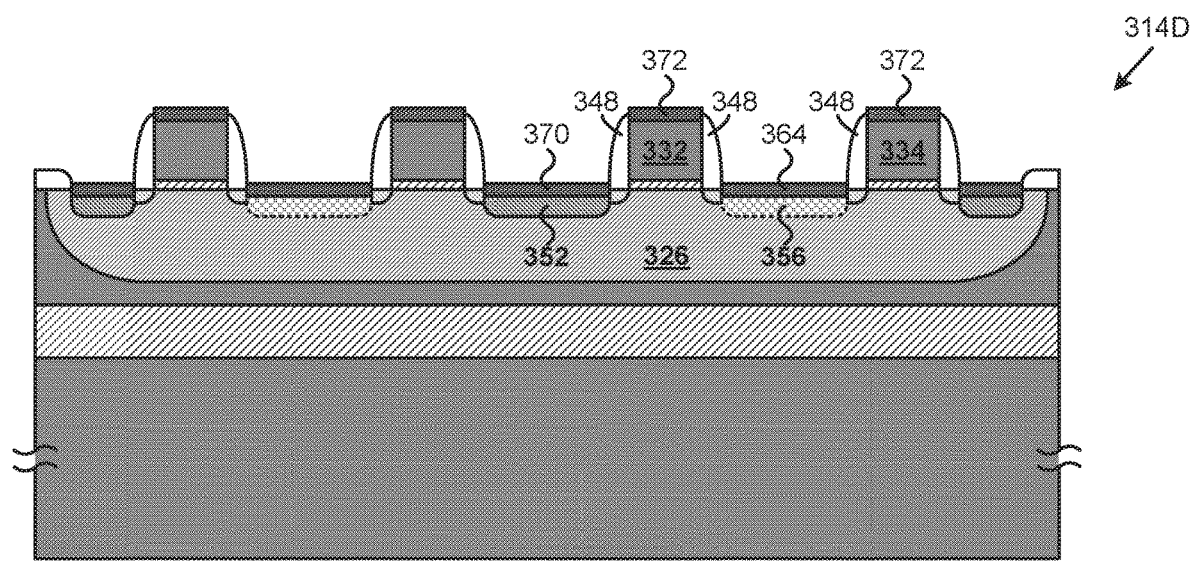
FIG. 9D illustrates a cross-sectional view of a portion of an SOI transistor structure corresponding to the SOI transistor structure of FIG. 9B according to one implementation of the present application.

FIG. 9C illustrates a cross-sectional view of a portion of an SOI transistor structure corresponding to the SOI transistor structure of FIG. 9B according to one implementation of the present application. FIG. 9C represents a cross-section along line "C-C" in FIG. 9B, after formation of common silicided regions 364. FIG. 9D illustrates a cross-sectional view of a portion of an SOI transistor structure corresponding to the SOI transistor structure of FIG. 9B according to one implementation of the present application. FIG. 9D represents a cross-section along line "D-D" in FIG. 9B, after formation of common silicided regions 364, drain silicided regions 370, and gate silicided regions 372. As shown in FIGS. 9C and 9D, SOT transistor structures 314C and 314D include transistor body 326, gate fingers 332 and 334, spacer dielectrics 348, source regions 350, drain regions 352, heavily-doped body-implant regions 356, common silicided regions 364, drain silicided regions 370, and gate silicided regions 372.

Heavily-doped body-implant regions 356 are situated inside of and overlap source regions 350. Common silicided regions 364 include body tie silicided regions 366 and source silicided regions 368. Body tie silicided regions 366 overlie heavily-doped body-implant regions 356. Source silicided regions 368 overlie source regions 350. Common silicided regions 364, drain silicided regions 370, and gate silicided regions 372 may be formed in a similar manner as described above with reference to action 114 in FIG. 1 and with reference to common silicided regions 264, drain silicided regions 270, and gate silicided regions 272 in FIGS. 8A and 8B.

SOI transistor structures 314C and 314D electrically tie source regions 350, heavily-doped body-implant regions 356, and transistor body 326 without a dedicated contact. Gate fingers 332 and 334 and drain silicided regions 370 will not be electrically shorted to source regions 350, and by extension, will not be electrically shorted to heavily-doped body-implant regions 356 and transistor body 326. SOI transistor structures 314C and 314D in FIGS. 9C and 9D offer different tradeoffs between parasitics, effective channel width, and output resistance, compared to SOI transistor structures 214A and 214B in FIGS. 8A and 8B.

Figure 10A:
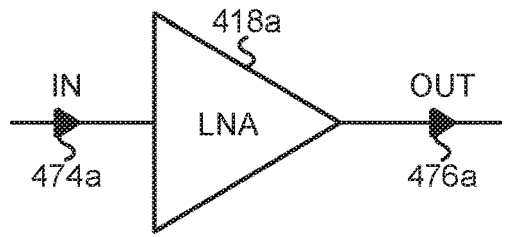
FIG. 10A illustrates a low-noise amplifier (LNA) according to one implementation of the present application.
Figure 10B:
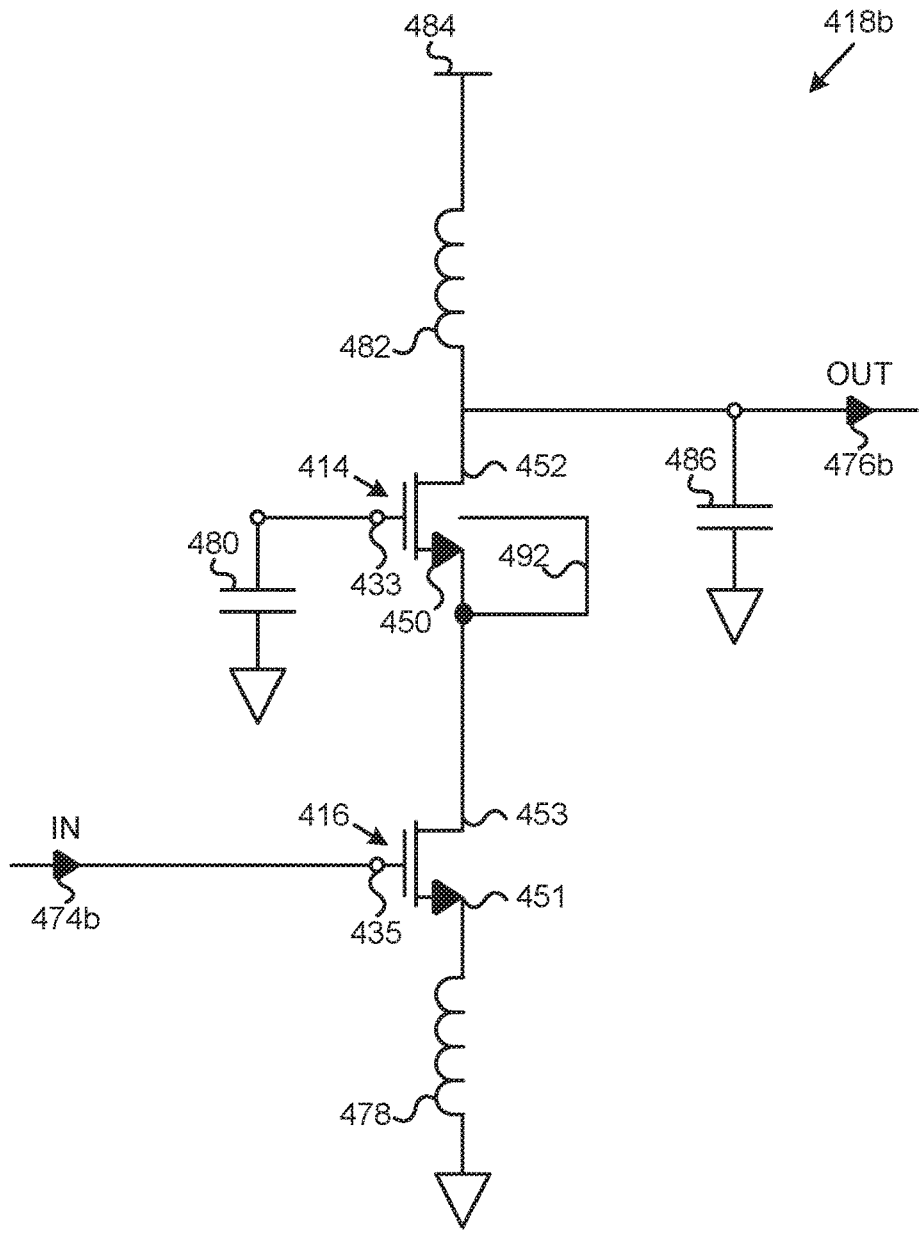
FIG. 10B illustrates a portion of an LNA circuit corresponding to the LNA of FIG. 10A and employing an SOI transistor according to one implementation of the present application.

FIG. 10A illustrates a low-noise amplifier (LNA) according to one implementation of the present application. LNA 418a amplifies electrical signals received at input 474a and provides the amplified electrical signals to output 476a. FIG. 10B illustrates a portion of an LNA circuit corresponding to LNA 418a of FIG. 10A and employing an SOI transistor according to one implementation of the present application.

As shown in FIG. 10B, LNA circuit 418b includes input 474b, SOI transistor 414 including gate 433, source 450, and drain 452, SOI transistor 416, including gate 435, source 451, and drain 453, source inductance 478, gate capacitance 480, drain inductance 482, supply voltage 484, load capacitance 486, and output 476b. LNA circuit 418b, input 474b, and output 476b in FIG. 10B generally correspond to LNA 418a, input 474a, and output 476a in FIG. 10A. SOI transistor 414 generally corresponds to SOT transistor structures 214A and 214B in FIGS. 8A and 8B, or to SOT transistor structures 314C and 314D in FIGS. 9C and 9D, and may have any implementations and advantages described above. As seen in FIG. 10B, transistor body 492 of SOI transistor 414 is shorted to its source 450.

Input 474b is coupled to gate 435 of SOI transistor 416. Source 451 of SOT transistor 416 is coupled to source inductance 478, which is coupled to ground. Drain 453 of SOI transistor 416 is coupled to source 450 of SOI transistor 416. Gate 433 of SOI transistor 414 is coupled to gate capacitance 480, which may represent a biasing voltage for SOI transistor 414. Drain 452 of SOI transistor 414 is coupled to drain inductance 482, which is coupled to supply voltage 484. Drain 452 of SOI transistor 416 is also coupled to output 476 and to load capacitance 486, which is coupled to ground.

LNA circuit 418b employs cascoded SOI transistors 414 and 416 to achieve amplification. SOI transistor 416 is preferably configured to optimize gain and minimize noise, and may be any SOI transistor known in the art. SOI transistor 414 is preferably configured to provide control over body effect and the linearity of the amplification and can be implemented as the inventive SOI transistor structures 214A and 214B in FIGS. 8A and 8B, or the inventive SOI transistor structures 314C and 314D in FIGS. 9C and 9D. These inventive transistor structures, i.e. SOT transistor structures 214A and 214B in FIGS. 8A and 8B, or SOT transistor structures 314C and 314D in FIGS. 9C and 9D, provide lower parasitics, lower gate resistance, and reduced body effects compared to conventional transistors. SOI transistor structures according to the present application may provide approximately five decibel-milliwatts (+5 dBm) improvement to linearity. Accordingly, SOI transistor structures according to the present application are particularly suited for use as SOI transistor 414 in LNA circuit 418b. Although an example of LNA 418a is described above, in one implementation, SOI transistor structures according to the present application can be utilized in a power amplifier (PA), which may utilize a similar circuit to LNA circuit 418b, albeit having multiple stages.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A semiconductor-on-insulator (SOI) transistor comprising:
a semiconductor layer situated over a buried oxide layer, said buried oxide layer being situated over a substrate;
said SOI transistor situated in said semiconductor layer and including a transistor body, gate fingers, source regions, and drain regions;
said transistor body having a first conductivity type, said source regions and said drain regions having a second conductivity type opposite to said first conductivity type;
a heavily-doped body-implant region having said first conductivity type overlapping at least one of said source regions;
a common silicided region electrically tying said heavily-doped body-implant region to said at least one of said source regions;
wherein said heavily-doped body-implant region is situated partially outside said source regions and near gate contacts;
wherein at least one of said gate fingers comprises a stub adjacent to said heavily-doped body-implant region.

2. The SOI transistor of claim 1, wherein said stub faces away from said drain regions.

3. The SOI transistor of claim 1, wherein said stub comprises a tapered portion.

4. The SOI transistor of claim 1, wherein said stub is overplotted relative to said source regions.

5. The SOI transistor of claim 1, wherein said stub comprises two tapered portions and is substantially trapezoidal.

6. The SOI transistor of claim 1, where said SOI transistor is utilized in a low noise amplifier (LNA).

7. The SOI transistor of claim 1, where said SOI transistor is utilized in a power amplifier (PA).

8. A semiconductor-on-insulator (SOI) transistor comprising:
a semiconductor layer situated over a buried oxide layer, said buried oxide layer being situated over a substrate;
said SOI transistor situated in said semiconductor layer and including a transistor body, gate fingers, source regions, and drain regions;
said transistor body having a first conductivity type, said source regions and said drain regions having a second conductivity type opposite to said first conductivity type;
a heavily-doped body-implant region having said first conductivity type overlapping at least one of said source regions;
a source silicided region and a drain silicided region being separated by said gate fingers;

a body tie silicided region situated over said heavily-doped body-implant region;

a common silicided region comprising said source silicided region and said body tie silicided region;

wherein said heavily-doped body-implant region is situated partially outside said source regions and near gate contacts;

wherein at least one of said gate fingers comprises a stub adjacent to said heavily-doped body-implant region.

9. The SOI transistor of claim 8, wherein said stub faces away from said drain regions.

10. The SOI transistor of claim 8, wherein said stub comprises a tapered portion.

11. The SOI transistor of claim 8, wherein said stub is overplotted relative to said source regions.

12. The SOI transistor of claim 8, wherein said stub comprises two tapered portions and is substantially trapezoidal.

13. The SOI transistor of claim 8, where said SOI transistor is utilized in a low noise amplifier (LNA).

14. The SOI transistor of claim 8, where said SOI transistor is utilized in a power amplifier (PA).

15. A semiconductor-on-insulator (SOI) transistor comprising:

a semiconductor layer situated over a buried oxide layer;

said SOI transistor situated in said semiconductor layer and including a transistor body, a gate finger, a source region, and a drain region;

said transistor body having a first conductivity type, said source region and said drain region having a second conductivity type opposite to said first conductivity type;

a body-implant region having said first conductivity type;

a silicided region electrically tying said body-implant region to said source region;

wherein said body-implant region is situated partially outside said source region and near a gate contact;

wherein said gate finger comprises a stub adjacent to said body-implant region.

16. The SOI transistor of claim 15, wherein said stub faces away from said drain region.

17. The SOI transistor of claim 15, wherein said stub comprises a tapered portion.

18. The SOI transistor of claim 15, wherein said stub is overplotted relative to said source region.

19. The SOI transistor of claim 15, wherein said stub comprises two tapered portions and is substantially trapezoidal.

20. The SOI transistor of claim 15, where said SOI transistor is utilized in a low noise amplifier (LNA).

* * * * *